United States Patent
Zhang et al.

(10) Patent No.: US 11,114,299 B2
(45) Date of Patent: Sep. 7, 2021

(54) TECHNIQUES FOR REDUCING TIP TO TIP SHORTING AND CRITICAL DIMENSION VARIATION DURING NANOSCALE PATTERNING

(71) Applicant: APPLIED Materials, Inc., Santa Clara, CA (US)

(72) Inventors: Qintao Zhang, Mt. Kisco, NY (US); Kyu-Ha Shim, Andover, MA (US); Rajesh Prasad, Lexington, MA (US)

(73) Assignee: Applied Materials, Inc., Santa Clara, CA (US)

( * ) Notice: Subject to any disclaimer, the term of this patent is extended or adjusted under 35 U.S.C. 154(b) by 27 days.

(21) Appl. No.: 16/569,944

(22) Filed: Sep. 13, 2019

(65) Prior Publication Data

US 2021/0005445 A1     Jan. 7, 2021

Related U.S. Application Data

(60) Provisional application No. 62/870,857, filed on Jul. 5, 2019.

(51) Int. Cl.
    *H01L 21/027*      (2006.01)
    *H01L 21/3105*      (2006.01)
    (Continued)

(52) U.S. Cl.
    CPC .... *H01L 21/0276* (2013.01); *H01L 21/31058* (2013.01); *H01L 21/31138* (2013.01);
    (Continued)

(58) Field of Classification Search
CPC ... H01L 21/311–31144; H01L 21/3115; H01L 21/31155; H01L 21/3086; H01L 21/266; H01L 21/0337; H01L 21/0338; H01L 21/0276; H01L 21/31138; H01L 21/31058; H01L 21/76816; H01L 29/66795; H01L 29/0649
See application file for complete search history.

(56) References Cited

U.S. PATENT DOCUMENTS 5,643,822 A * 7/1997 Furukawa ......... H01L 21/76237
    438/421
6,268,263 B1 * 7/2001 Sakai ................ H01L 21/31053
    438/424

(Continued)

OTHER PUBLICATIONS

Vallée et al., "Plasma deposition—Impact of ions in plasma enhanced chemical vapor deposition, plasma enhanced atomic layer deposition, and applications to area selective deposition", J. Vac. Sci. Technol. A, 38(3), May/Jun. 2020, pp. 38, 033007-1 to 38, 033007-15. (Year: 2020).*

*Primary Examiner* — Mary A Wilczewski
(74) *Attorney, Agent, or Firm* — Kacvinsky Daisak Bluni PLLC

(57) ABSTRACT

A method of forming surface features in a hardmask layer, including etching a first surface feature into the hardmask layer, the first surface feature having a first critical dimension, performing an ion implantation process on the first surface feature to make the first surface feature resistant to subsequent etching processes, etching a second surface feature into the hardmask layer adjacent the first surface feature, wherein the first critical dimension is preserved.

19 Claims, 3 Drawing Sheets

(51) Int. Cl.
*H01L 21/311* (2006.01)
*H01L 21/3115* (2006.01)
*H01L 21/768* (2006.01)
*H01L 29/66* (2006.01)
*H01L 21/033* (2006.01)

(52) U.S. Cl.
CPC .. *H01L 21/31144* (2013.01); *H01L 21/31155* (2013.01); *H01L 21/76816* (2013.01); *H01L 29/66795* (2013.01)

(56) References Cited

U.S. PATENT DOCUMENTS

| | | | | |
|---|---|---|---|---|
| 6,316,168 B1* | 11/2001 | Butt | | H01L 21/0276 430/314 |
| 8,324,107 B2* | 12/2012 | Zhou | | H01L 21/0338 438/700 |
| 9,312,143 B1* | 4/2016 | Cheng | | H01L 21/31155 |
| 9,437,674 B2* | 9/2016 | Ahmed | | H01L 21/76224 |
| 9,601,513 B1* | 3/2017 | Hook | | H01L 21/3065 |
| 9,691,766 B1* | 6/2017 | Lin | | H01L 27/0886 |
| 10,347,578 B2* | 7/2019 | Zhang | | H01L 21/76813 |
| 10,395,937 B2* | 8/2019 | Tsai | | H01L 21/31144 |
| 10,658,380 B2* | 5/2020 | King | | H01L 27/11573 |
| 2012/0258600 A1* | 10/2012 | Godet | | H01L 21/311 438/705 |
| 2014/0183159 A1* | 7/2014 | Posseme | | H01B 13/0026 216/13 |
| 2014/0327117 A1* | 11/2014 | Bencher | | H01L 21/02266 257/649 |
| 2018/0047665 A1* | 2/2018 | Zhang | | H01L 21/76843 |
| 2019/0148147 A1* | 5/2019 | Huang | | H01L 21/0274 438/703 |
| 2019/0164805 A1* | 5/2019 | Chou | | H01L 27/0886 |
| 2019/0348281 A1* | 11/2019 | Xu | | H01L 21/31058 |
| 2019/0371678 A1* | 12/2019 | Song | | H01L 21/31053 |
| 2020/0144061 A1* | 5/2020 | Mignot | | G03F 7/2022 |
| 2020/0194314 A1* | 6/2020 | Song | | H01L 27/0928 |
| 2021/0005445 A1* | 1/2021 | Zhang | | H01L 21/31058 |

* cited by examiner

TECHNIQUES FOR REDUCING TIP TO TIP SHORTING AND CRITICAL DIMENSION VARIATION DURING NANOSCALE PATTERNING

FIELD OF THE DISCLOSURE

Embodiments of the present disclosure relate to transistor processing techniques, and more particularly, to processing for three-dimensional device formation.

BACKGROUND OF THE DISCLOSURE

As semiconductor devices continue to scale to smaller dimensions, the patterning of surface features in semiconductor substrates employed in such devices becomes increasingly difficult due to the small size and dense packing of such features. For example, in the manufacture of fin field-effect transistor (FinFET) devices, it has become challenging to form nanometer-scale trench features in semiconductor substrates using conventional lithography processes while avoiding so-called "tip-to-tip shorting," wherein adjacent trenches may inadvertently run into one another. Tip-to-tip shorting in FinFET devices may be detrimental to the overall performance of a device and is therefore undesirable.

A further challenge in patterning trenches for modern FinFET devices is the difficulty associated with reducing critical dimension variation among trenches. Particularly, when trenches are formed in a semiconductor substrate using modern, multiple-mask techniques, the process of forming (e.g., etching) a trench in a substrate may adversely affect the critical dimensions (e.g., widths) of previously formed trenches in the substrate, thus resulting in a lack of uniformity among the trenches. Critical dimension variation in FinFET devices may be detrimental to the overall performance of a device and is therefore undesirable.

A need exists for efficient, inexpensive processes for patterning device features (e.g., trenches) in semiconductor substrates in a manner facilitating small feature sizes and dense packing while mitigating critical dimension variation and tip-to-tip shorting.

With respect to these and other considerations, the present improvements may be useful.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

A method of forming surface features in a hardmask layer in accordance with an exemplary embodiment of the present disclosure may include etching a first surface feature into the hardmask layer, the first surface feature having a first critical dimension, performing an ion implantation process on the first surface feature to make the first surface feature resistant to subsequent etching processes, and etching a second surface feature into the hardmask layer adjacent the first surface feature, wherein the first critical dimension is preserved.

Another method of forming surface features in a hardmask layer in accordance with an exemplary embodiment of the present disclosure may include providing a layer stack including the hardmask layer, a first bottom antireflective coating (BARC) layer disposed on the hardmask layer, a first planarization layer disposed on the BARC layer, and a first photoresist layer disposed on the planarization layer, performing a first photolithography process to etch a first trench patterned by the first photoresist layer into the first planarization layer and the first BARC layer, performing a first ion etching process wherein an ion beam formed of reactive plasma ions is directed into the first trench to extend the first trench into the hardmask layer, the first trench having a first critical dimension, performing an ion implantation process on the first trench to make the first trench resistant to subsequent etching processes, removing the first photoresist layer, the first planarization layer, and the first BARC layer from the hardmask layer, applying a second BARC layer, a second planarization layer, and a second photoresist layer atop the hardmask layer, performing a second photolithography process to etch a second trench patterned by the second photoresist layer into the second planarization layer and the second BARC layer, and performing a second ion etching process wherein an ion beam formed of reactive plasma ions is directed into the second trench to extend the second trench into the hardmask layer, wherein the first critical dimension is preserved.

Another method of forming surface features in a hardmask layer in accordance with an exemplary embodiment of the present disclosure may include etching a first surface feature into the hardmask layer, the first surface feature having lateral sidewalls extending in a first direction and longitudinal sidewalls extending in a second direction perpendicular to the first direction, etching a second surface feature into the hardmask layer, the second surface feature spaced apart from the first surface feature a first distance in the first direction, the second surface feature having lateral sidewalls extending in the first direction and longitudinal sidewalls extending in the second direction, performing an ion implantation process on the lateral sidewalls of the first and second surface features to make the lateral sidewalls resistant to subsequent etching processes, and performing an etching process on the first and second surface features, wherein the longitudinal sidewalls of the first and second surface features are etched to shorten the spacing between the first and second surface features from the first distance to a second distance, and wherein the lateral sidewalls are unaffected by the etching process and critical dimensions of the first and second surface features are maintained.

BRIEF DESCRIPTION OF THE DRAWINGS

By way of example, various embodiments of the disclosed techniques will now be described with reference to the accompanying drawings, wherein.

DETAILED DESCRIPTION

Figure 1A:
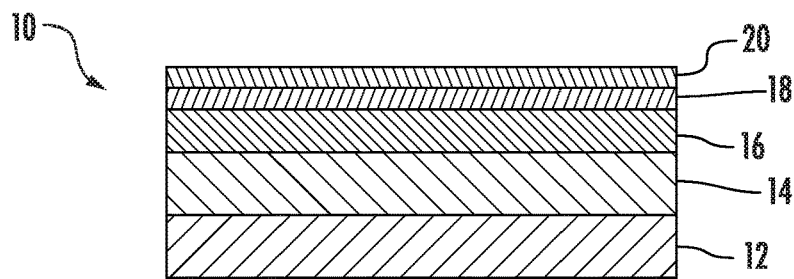
FIGS. 1A-1J are a series of cross-sectional views illustrating a method of forming surface features in a hardmask layer and in an underlying semiconductor layer in accordance with an exemplary embodiment of the present disclosure.

The present embodiments will now be described more fully hereinafter with reference to the accompanying drawings, wherein some exemplary embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques to pattern substrates, and in particular novel techniques to etch nanometer-scale (e.g., 2 nanometer to 100 nanometer) surface features in substrates such as hardmasks for facilitating the patterning of such features in underlying semiconductor layers. Examples of surface features include trenches formed within a substrate. The term "trench" may refer to a void extending through the entirety of the thickness of a substrate. The term "trench" may also refer to a void such as a depression or recess formed within a substrate and not extending through the entirety of the thickness of the substrate.

Referring to FIGS. 1A-1J, an exemplary process for forming surface features in a hardmask layer and in an underlying semiconductor layer while mitigating critical dimension variation in the surface features is shown. As illustrated in FIG. 1A, a layer stack 10 may be provided including a semiconductor layer 12, a hardmask layer 14, a first planarization layer 16, a first bottom antireflective coating (BARC) layer 18, and a first photoresist layer 20 disposed in a vertically stacked arrangement in the aforementioned order. The semiconductor layer 12 may be formed of any suitable semiconductor material, including, and not limited to, silicon (e.g., crystalline silicon), germanium, silicon carbide, gallium arsenide, gallium nitride, etc. The hardmask layer 14 may be formed of any conventional hardmask material, including, and not limited to, amorphous silicon, amorphous carbon, etc. The first planarization layer 16 may be formed of any conventional planarization material, including, and not limited to, polyimide films, resins, low-viscosity epoxies, spin-on glass (SOG), etc. The first BARC layer 18 may be formed of any suitable organic or inorganic BARC material familiar to those of ordinary skill in the art. The first photoresist layer 20 may be formed of any suitable, light-sensitive organic material familiar to those of ordinary skill in the art.

Figure 1B:
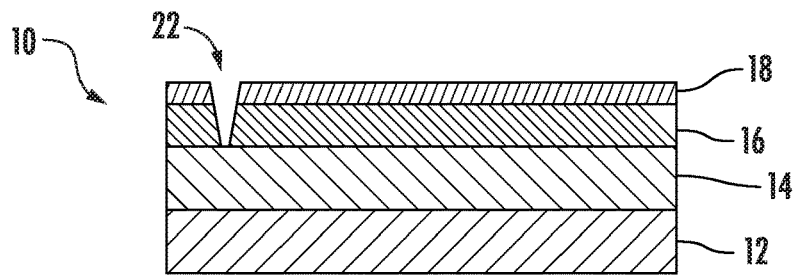

Referring to FIG. 1B, a photolithography process may be performed on the layer stack 10, wherein a desired pattern defined by the first photoresist layer 20 may be etched into the underlying first planarization layer 16 and first BARC layer 18. In the present example, the pattern defined by the first photoresist layer 20 may include a first trench 22. The first trench 22 may extend entirely through the first planarization layer 16 and the first BARC layer 18 and may expose the underlying upper surface of the hardmask layer 14. The photolithography process may further include removal (e.g., etching or dissolving) of the first photoresist layer 20.

Figure 1C:
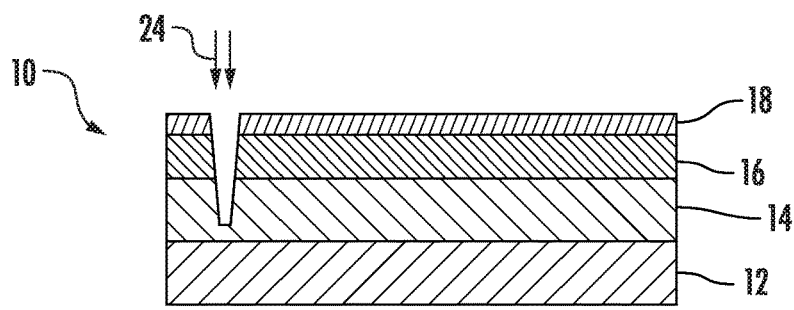

Referring to FIG. 1C, an ion etching process (e.g., a reactive-ion etching process) may be performed on the layer stack 10, wherein an ion beam 24 formed of reactive plasma ions may be directed into the first trench 22 at an angle perpendicular to the upper surface of the hardmask layer 14. The ion beam 24 may etch the hardmask layer 14, thus extending the first trench 22 partly into the hardmask layer 14 to a depth several nanometers above the upper surface of the underling semiconductor layer 12.

Figure 1D:
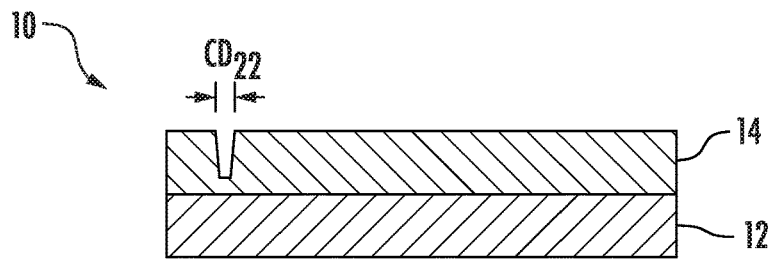

Referring to FIG. 1D, the first planarization layer 16 and the first BARC layer 18 may be removed from the hardmask layer 14. For example, the first planarization layer 16 and the first BARC layer 18 may be etched (e.g., via reactive-ion etching) or otherwise stripped away to expose the upper surface of the hardmask layer 14. The first trench 22 in the hardmask layer 14 may have a first critical dimension (e.g., a greatest lateral width) of $CD_{22}$ and may have a tapered profile as illustrated in FIG. 1D. In various alternative embodiments, the first trench 22 may have a non-tapered profile (i.e., a continuous width from top to bottom).

Figure 1E:
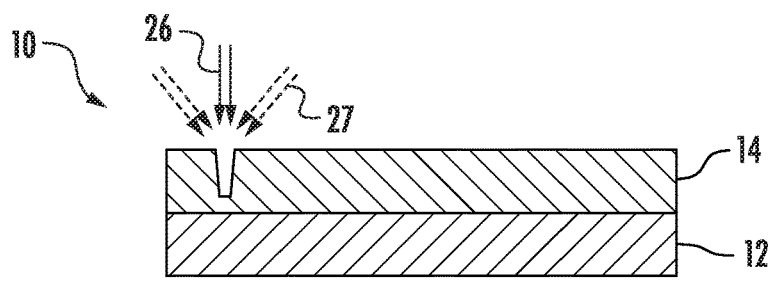

Referring to FIG. 1E, an ion implantation process may be performed on the hardmask layer 14, wherein an ion beam 26 formed of an ionized dopant species may be directed into the first trench 22 at an angle perpendicular to the upper surface of the hardmask layer 14. In various alternative embodiments, the ion beam 26 may be tilted or otherwise directed toward lateral sidewalls of the first trench 22 at acute angles relative to the upper surface of the hardmask layer 14 as indicated by the dashed arrows 27 shown in FIG. 1E. The dopant species transmitted in the ion beam 26 may be selected to make the lateral sidewalls and the floor of the first trench 22 resistant to subsequent etching processes performed on the hardmask layer 14 during the formation of additional trenches in the hardmask layer 14 as further described below. In various examples, the dopant species may be carbon, boron, difluoroboron, germanium, silicon, etc. The present disclosure is not limited in this regard.

Figure 1F:
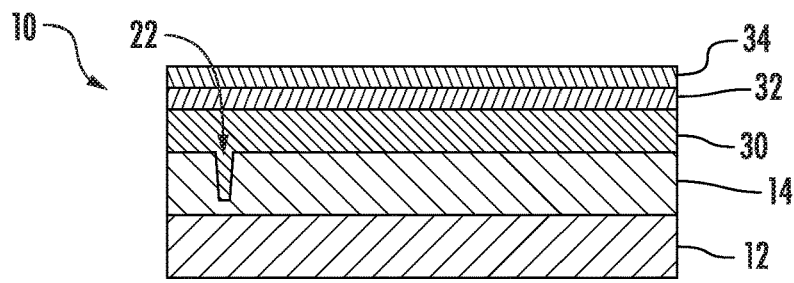

Referring to FIG. 1F, a second planarization layer 30, a second BARC layer 32, and a second photoresist layer 34 may be deposited on the hardmask layer 14 in a vertically stacked arrangement in the aforementioned order. The second planarization layer 30, the second BARC layer 32, and the second photoresist layer 34 may be similar to (e.g., formed of the same materials as) the first planarization layer 16, the first BARC layer 18, and the first photoresist layer 20 described above. As shown, the second planarization layer 30 may cover the hardmask layer 14 and may fill the first trench 22 while providing an upper surface generally parallel to the upper surface of the hardmask layer 14.

Figure 1G:
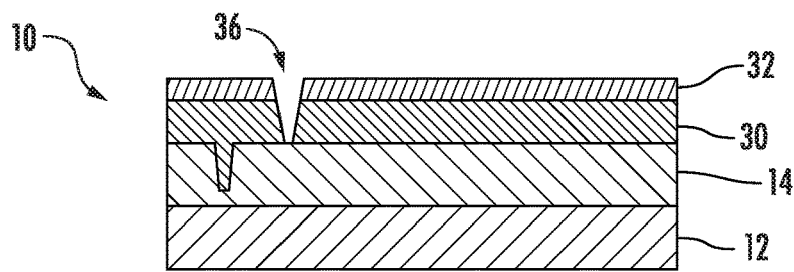

Referring to FIG. 1G, a photolithography process may be performed on the layer stack 10, wherein a desired pattern defined by the second photoresist layer 34 may be etched into the underlying second planarization layer 30 and second BARC layer 32. In the present example, the pattern defined by the second photoresist layer 34 may include a second trench 36 located adjacent the first trench 22. The second trench 36 may extend entirely through the second planarization layer 30 and the second BARC layer 32 and may expose the underlying upper surface of the hardmask layer 14. The photolithography process may further include removal (e.g., etching or dissolving) of the second photoresist layer 34.

Figure 1H:
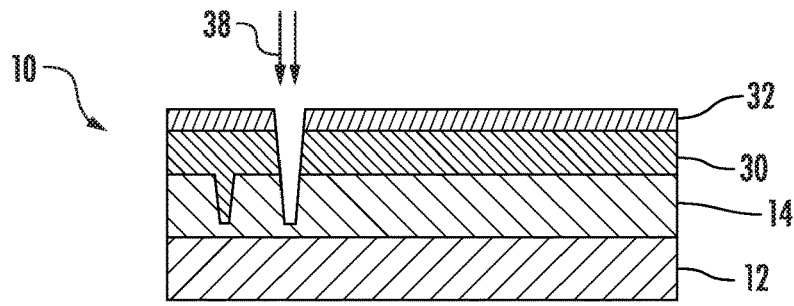

Referring to FIG. 1H, an ion etching process (e.g., a reactive-ion etching process) may be performed on the layer stack 10, wherein an ion beam 38 formed of reactive plasma ions may be directed into the second trench 36 at an angle perpendicular to the upper surface of the hardmask layer 14. The ion beam 38 may etch the hardmask layer 14, thus extending the second trench 36 partly into the hardmask layer 14 to a depth several nanometers above the upper surface of the underlying semiconductor layer 12. In a non-limiting example, the depth of the second trench 36 as measured from the top surface of the hardmask layer 14 may be equal to the depth of the first trench 22.

Figure 1I:
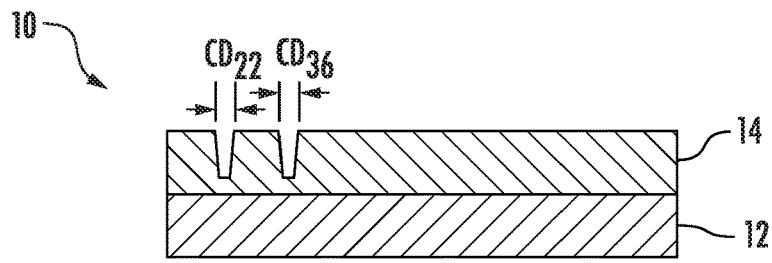

Referring to FIG. 1I, the second planarization layer 30 and the second BARC layer 32 may be removed from the hardmask layer 14. For example, the second planarization layer 30 and the second BARC layer 32 may be etched (e.g., via reactive-ion etching) or otherwise stripped away to expose the upper surface of the hardmask layer 14. This operation may include etching away the portion of the second planarization layer 30 filling the first trench 22 to expose the sidewalls and the bottom of the first trench 22. Owning to the ion implantation process previously performed on the lateral sidewalls of the first trench 22 (as described above and as illustrated in FIG. 1E), the lateral sidewalls and the bottom of the first trench 22 may be resistant to the etching process performed to remove the portion of the second planarization layer 30 filling the first trench 22. Thus, the profile and size of the first trench 22 may be generally unaffected (i.e., not further enlarged) by the etching process, and the first critical dimension $CD_{22}$ of the first trench 22 may be maintained.

The second trench 36 in the hardmask layer 14 may have a second critical dimension of $CD_{36}$ and may have a tapered profile as illustrated in FIG. 1I. In various alternative embodiments, the second trench 36 may have a non-tapered profile (i.e., a continuous width from top to bottom). In various embodiments, the second critical dimension $CD_{36}$ may be equal to the first critical dimension $CD_{22}$ of the first trench 22.

Figure 1J:
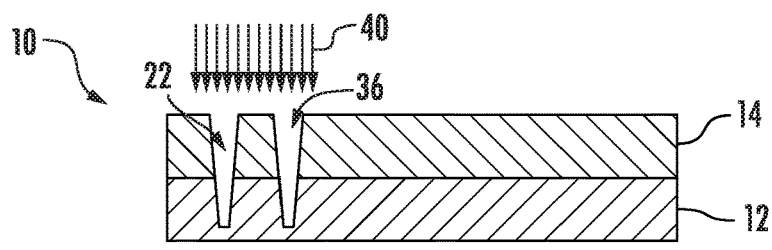

Referring to FIG. 1J, a final ion etching process (e.g., a reactive-ion etching process) may be performed on the layer stack 10, wherein an ion beam 40 formed of reactive plasma ions may be directed into the first and second trenches 22, 36 at an angle perpendicular to the upper surface of the hardmask layer 14. The ion beam 40 may etch and extend the first and second trenches 22, 36 entirely through the hardmask layer 14 and partly into the semiconductor layer 12. The first and second trenches 22, 36 defined by the hardmask layer 14 (and formed according to the processes described above) are thus transferred to the semiconductor layer 12.

The exemplary process described above and illustrated in FIGS. 1A-1J results in the patterning of two trenches in the semiconductor layer 12. The present disclosure is not limited in this regard, and the processes illustrated in FIGS. 1F-1I may be repeated as many times as necessary to create a desired number of trenches or other features in the hardmask layer 14 prior to transferring such trenches and other features to the semiconductor layer 12 in the final ion etching process shown in FIG. 1J.

Figure 2A:
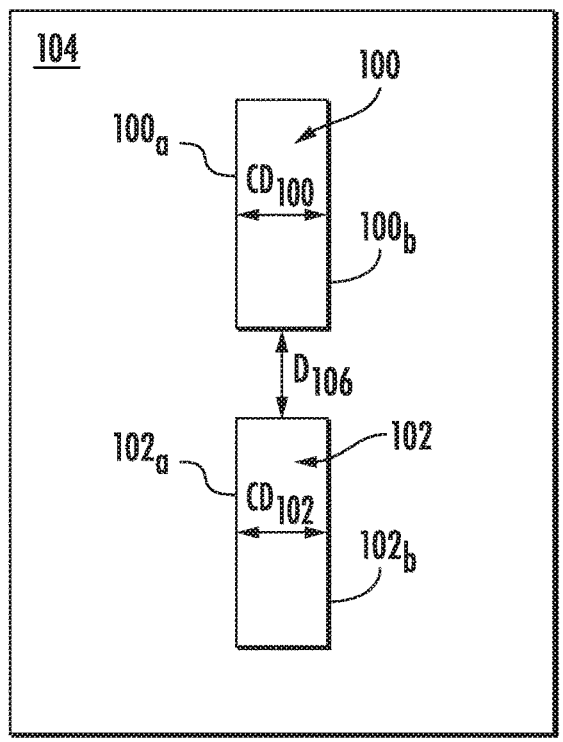
FIGS. 2A and 2B are a series of plan views illustrating another method of forming surface features in a hardmask layer and in an underlying semiconductor layer in accordance with an exemplary embodiment of the present disclosure.
Figure 2B:
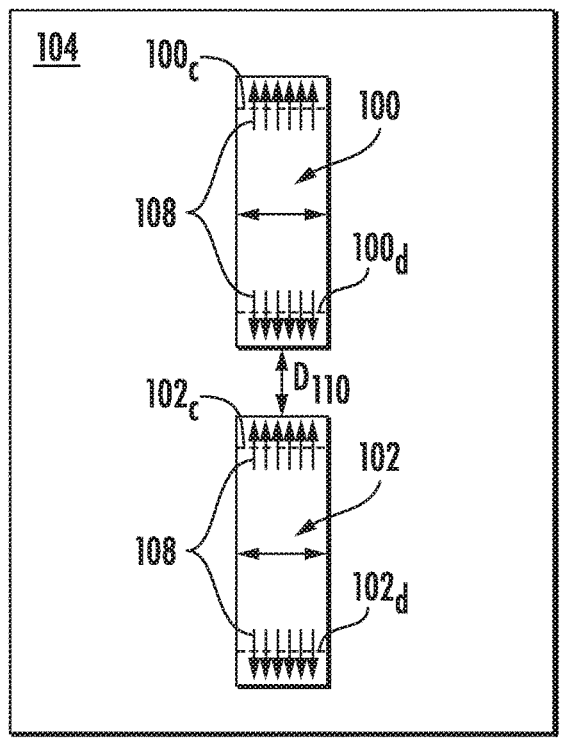

Referring to FIGS. 2A and 2B, an exemplary process for forming surface features in a hardmask layer and in an underlying semiconductor layer with nanometer-scale tip-to-tip distances while avoiding tip-to-tip shorting and while mitigating critical dimension variation in the surface features is shown.

Referring to FIG. 2A, a first trench 100 and a second trench 102 may be formed in a hardmask layer 104 using the processes described above and illustrated in FIGS. 1A-1I, with the exception of the first and second trenches 100, 102 being longitudinally adjacent and in line with one another, whereas the first and second trenches 22, 36 shown in FIGS. 1A-1I are laterally adjacent one another. Additionally, lateral sidewalls 100a, 100b and 102a, 102b of the first and second trenches 100, 102 may be treated with ion implantation processes in the manner described above and illustrated in FIG. 1E for making the lateral sidewalls 100a, 100b and 102a, 102b resistant to subsequent etching processes as further described below.

The first trench 100 may have a first critical dimension (e.g., a greatest lateral width) of $CD_{100}$ and the second trench 102 may have a second critical dimension of $CD_{102}$. In various embodiments, the first critical dimension $CD_{100}$ may be equal to the second critical dimension $CD_{102}$. The first and second trenches 100, 102 may be longitudinally spaced apart from one another a first distance $D_{106}$, wherein the first distance $D_{106}$ is a spacing attainable using conventional photolithography processes (e.g., in the manner described above and illustrated in FIGS. 1B and 1G) while avoiding the risk of tip-to-tip shorting between the first and second trenches 100, 102.

Referring to FIG. 2B, one or more ion etching processes (e.g., reactive-ion etching processes) may be performed on the first and second trenches 100, 102, wherein ion beams 108 formed of reactive plasma ions may be directed into the first and second trenches 100, 102 and may strike the longitudinal sidewalls 100c, 100d and 102c, 102d of the first and second trenches 100, 102. The ion beams 38 may etch the longitudinal sidewalls 100c, 100d and 102c, 102d, thus extending/enlarging the first and second trenches 100, 102 longitudinally. The lengthening of the first and second trenches 100, 102 resultantly shortens the longitudinal spacing between the first and second trenches 100, 102 to a second distance $D_{110}$, wherein the second distance $D_{110}$ is less than $D_{106}$ and is a spacing generally unattainable using conventional photolithography processes while avoiding the risk of tip-to-tip shorting between the first and second trenches 100, 102. In various non-limiting embodiments, the second distance $D_{110}$ may be in a range of 2 nanometers to 100 nanometers.

Owning to the ion implantation process previously performed on the lateral sidewalls 100a, 100b and 102a, 102b of the first and second trenches 100, 102, the lateral sidewalls 100a, 100b and 102a, 102b may be resistant to the etching process(es) performed on the first and second trenches 100, 102 (as shown in FIG. 2B) for reducing the longitudinal spacing therebetween. Thus, the lateral sidewalls 100a, 100b and 102a, 102b of the first and second trenches 100, 102 may be generally unaffected by the etching process(es), and the first and second critical dimensions $CD_{100}$, $CD_{102}$ may be maintained.

The exemplary process described above and illustrated in FIGS. 2A and 2B results in the patterning of two trenches in the hardmask layer 104. The present disclosure is not limited in this regard, and the processes illustrated in FIGS. 2A and 2B may be repeated as many times as necessary to create a desired number of trenches in the hardmask layer 104 prior to transferring such trenches to an underlying semiconductor layer (not within view) in a final ion etching process in a manner similar to the process described above and shown in FIG. 1J.

The above-described processes provide several advantages in the art. For example, the process illustrated in FIGS. 1A-1J provides a relatively inexpensive and efficient method of forming surface features in a hardmask layer and in an underlying semiconductor layer while mitigating critical dimension variation in the surface features. Additionally, the process illustrated in FIGS. 2A-2B provides a relatively inexpensive and efficient method of forming surface features in a hardmask layer and in an underlying semiconductor layer with nanometer-scale tip-to-tip distances while mitigating tip-to-tip shorting and critical dimension variation in the surface features.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, while the present disclosure has been described herein in the context of a particular implementation in a particular environment for a particular purpose, those of ordinary skill in the art will recognize its usefulness is not limited thereto. Embodiments of the present disclosure may be beneficially implemented in any number of environments for any number of purposes. Accordingly, the claims set forth below shall be construed in view of the full breadth and spirit of the present disclosure as described herein.

The invention claimed is:

1. A method of forming surface features in a hardmask layer, comprising:
   etching a first surface feature into a top surface of the hardmask layer, the first surface feature having a first critical dimension;
   performing an ion implantation process on the first surface feature, wherein an ion beam formed of an ionized dopant species is directed at the first surface feature and implants the ionized dopant species into the first surface feature to make the first surface feature resistant to subsequent etching processes;
   depositing a planarization layer on the hardmask layer, the planarization layer filling the first surface feature; and
   etching a second surface feature into the top surface of the hardmask layer distant from the first surface feature along the top surface of the hardmask layer; and
   performing an etching process to remove the planarization layer from the hardmask layer and from within the first surface feature, wherein the first surface feature is resistant to the etching process and the first critical dimension is preserved.

2. The method of claim 1, wherein the first surface feature and the second surface feature are trenches.

3. The method of claim 1, wherein the first critical dimension is a width of the first surface feature.

4. The method of claim 1, wherein the planarization layer is a second planarization layer and wherein etching the first surface feature into the hardmask layer comprises:
   performing a photolithography process using a first photoresist layer to etch a trench into a first planarization layer and first bottom antireflective coating (BARC) layer disposed on the hardmask layer; and
   performing an ion etching process wherein an ion beam formed of reactive plasma ions is directed into the trench to extend the trench into the hardmask layer.

5. The method of claim 4, further comprising removing the first photoresist layer, the first planarization layer, and the first BARC layer from the hardmask layer.

6. The method of claim 1, wherein the dopant species is selected from one of carbon, boron, difluoroboron, germanium, and silicon to make the first surface feature resistant to subsequent etching processes performed on the hardmask layer.

7. The method of claim 1, further comprising performing an ion implantation process on the second surface feature to make the second surface feature resistant to subsequent etching processes.

8. The method of claim 7, wherein the second surface feature has a second critical dimension, further comprising etching a third surface feature into the hardmask layer adjacent the second surface feature, wherein the first critical dimension and the second critical dimension are preserved.

9. The method of claim 1, further comprising performing an etching process on the hardmask layer wherein the first and second surface features are extended entirely through the hardmask layer and into an underlying semiconductor layer.

10. A method of forming surface features in a hardmask layer, comprising:
    providing a layer stack including the hardmask layer, a first bottom antireflective coating (BARC) layer disposed on the hardmask layer, a first planarization layer disposed on the BARC layer, and a first photoresist layer disposed on the first planarization layer;
    performing a first photolithography process to etch a first trench patterned by the first photoresist layer into the first planarization layer and the first BARC layer;
    performing a first ion etching process wherein an ion beam formed of reactive plasma ions is directed into the first trench to extend the first trench into the hardmask layer, the first trench having a first critical dimension;
    performing an ion implantation process on the first trench to make the first trench resistant to subsequent etching processes;
    removing the first photoresist layer, the first planarization layer, and the first BARC layer from the hardmask layer;
    applying a second BARC layer, a second planarization layer, and a second photoresist layer a atop the hardmask layer;
    performing a second photolithography process to etch a second trench patterned by the second photoresist layer into the second planarization layer and the second BARC layer; and
    performing a second ion etching process wherein an ion beam formed of reactive plasma ions is directed into the second trench to extend the second trench into the hardmask layer, wherein the first critical dimension is preserved.

11. A method of forming surface features in a hardmask layer, comprising:
    etching a first surface feature into the hardmask layer, the first surface feature having a first critical dimension and having lateral sidewalls extending in a first direction and longitudinal sidewalls extending in a second direction perpendicular to the first direction;
    etching a second surface feature into the hardmask layer, the second surface feature spaced apart from the first surface feature a first distance in the first direction, the second surface feature having a second critical dimension and having lateral sidewalls extending in the first direction and longitudinal sidewalls extending in the second direction;
    performing an ion implantation process on the lateral sidewalls of the first and second surface features to make the lateral sidewalls resistant to subsequent etching processes; and
    performing an etching process on the first and second surface features, wherein the longitudinal sidewalls of the first and second surface features are etched to shorten a spacing between the first and second surface features from the first distance to a second distance, and wherein the lateral sidewalls are unaffected by the etching process and the first and second critical dimensions are maintained.

12. The method of claim 11, wherein the first surface feature and the second surface feature are trenches.

13. The method of claim 11, wherein the first critical dimension and the second critical dimension are lateral widths of the first and second surface features, respectively.

14. The method of claim 11, wherein etching the first surface feature into the hardmask layer comprises:
    performing a photolithography process using a first photoresist layer to etch a trench into a first planarization layer and first bottom antireflective coating (BARC) layer disposed on the hardmask layer; and performing an ion etching process wherein an ion beam formed of reactive plasma ions is directed into the trench to extend the trench into the hardmask layer.

15. The method of claim 14, further comprising removing the first photoresist layer, the first planarization layer, and the first BARC layer from the hardmask layer.

16. The method of claim 15, further comprising applying a second BARC layer, a second planarization layer, and a second photoresist layer a atop the hardmask layer.

17. The method of claim 11, wherein performing the ion implantation process on the lateral sidewalls of the first and second surface features comprises directing an ion beam formed of an ionized dopant species at the lateral sidewalls, the dopant species selected from one of carbon, boron, difluoroboron, germanium, and silicon to make the lateral sidewalls resistant to subsequent etching processes performed on the hardmask layer.

18. The method of claim 11, further comprising performing an etching process on the hardmask layer wherein the first and second surface features are extended entirely through the hardmask layer and into an underlying semiconductor layer.

19. The method of claim 11, wherein the second distance is in a range of 2 nanometers to 100 nanometers.

* * * * *